(12) United States Patent
Fukumizu et al.

(10) Patent No.: US 8,264,866 B2
(45) Date of Patent: Sep. 11, 2012

(54) NONVOLATILE MEMORY DEVICE AND METHOD FOR MANUFACTURING SAME

(75) Inventors: Hiroyuki Fukumizu, Mie-ken (JP);
Yasuhiro Nojiri, Kanagawa-ken (JP);
Tsukasa Nakai, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/881,658

(22) Filed: Sep. 14, 2010

(65) Prior Publication Data

US 2011/0069525 A1    Mar. 24, 2011

(30) Foreign Application Priority Data

Sep. 24, 2009  (JP) ................. 2009-219625

(51) Int. Cl.
*G11C 11/00* (2006.01)
(52) U.S. Cl. ....................................... 365/148
(58) Field of Classification Search ............. 365/148
See application file for complete search history.

(56) References Cited

U.S. PATENT DOCUMENTS

| | | | |
|---|---|---|---|
| 6,955,937 B1 | 10/2005 | Burke et al. | |
| 7,348,653 B2 | 3/2008 | Cho et al. | |
| 2006/0284181 A1* | 12/2006 | Chae et al. | 257/66 |
| 2007/0003741 A1 | 1/2007 | Sakurai et al. | |
| 2007/0158697 A1* | 7/2007 | Choi et al. | 257/246 |
| 2008/0070162 A1 | 3/2008 | Ufert | |
| 2009/0166609 A1* | 7/2009 | Schricker et al. | 257/40 |
| 2009/0302302 A1* | 12/2009 | Heo et al. | 257/4 |

FOREIGN PATENT DOCUMENTS

| | | |
|---|---|---|
| JP | 2005-57012 | 3/2005 |
| JP | 2006-196900 | 7/2006 |
| JP | 2007-184561 | 7/2007 |
| JP | 2007-324600 | 12/2007 |
| JP | 2008-235637 | 10/2008 |
| JP | 2009-516362 | 4/2009 |
| JP | 2009-130138 | 6/2009 |
| JP | 2010-524238 | 7/2010 |
| KR | 10-2007-0115707 | 12/2007 |
| KR | 10-2009-0083094 | 8/2009 |
| WO | WO 2007/083362 A1 | 7/2007 |
| WO | WO 2008/124328 A2 | 10/2008 |
| WO | WO 2008/124328 A3 | 10/2008 |
| WO | WO 2008/124328 A4 | 10/2008 |

OTHER PUBLICATIONS

Japanese Office Action issued Oct. 7, 2011, in Patent Application No. 2009-219625 (with English-language translation).
U.S. Appl. No. 13/075,658, filed Mar. 30, 2011, Nojiri, et al.
U.S. Appl. No. 13/044,865, filed Mar. 10, 2011, Fukumizu, et al.
Office Action issued Aug. 26, 2011 in Japanese Patent Application No. 10-2010-91874 (with English translation).

* cited by examiner

*Primary Examiner* — Hoai V Ho
*Assistant Examiner* — Min Huang
(74) *Attorney, Agent, or Firm* — Oblon, Spivak, McClelland, Maier & Neustadt, L.L.P.

(57) ABSTRACT

According to one embodiment, a nonvolatile memory device includes a memory cell. The memory cell is connected to a first interconnection and a second interconnection and includes a plurality of layers. The plurality of layers includes a memory layer and a carbon nanotube-containing layer which is in contact with the memory layer and contains a plurality of carbon nanotubes.

16 Claims, 13 Drawing Sheets

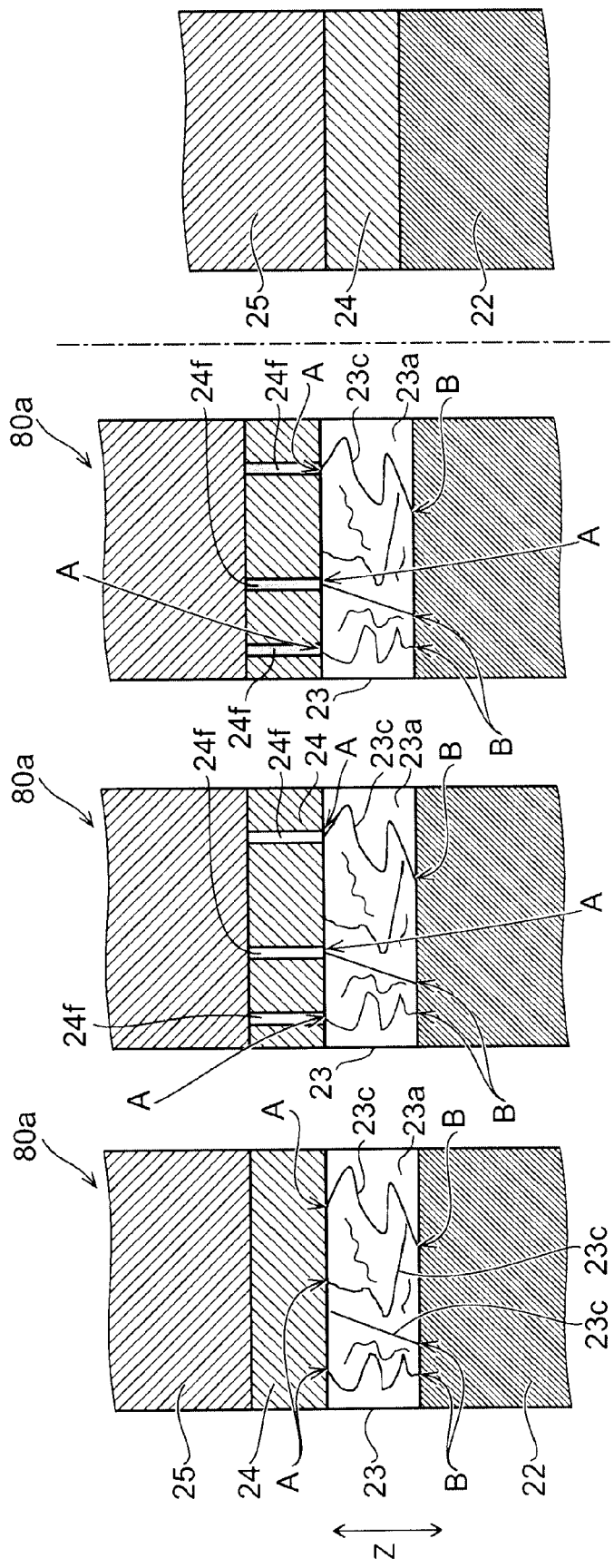

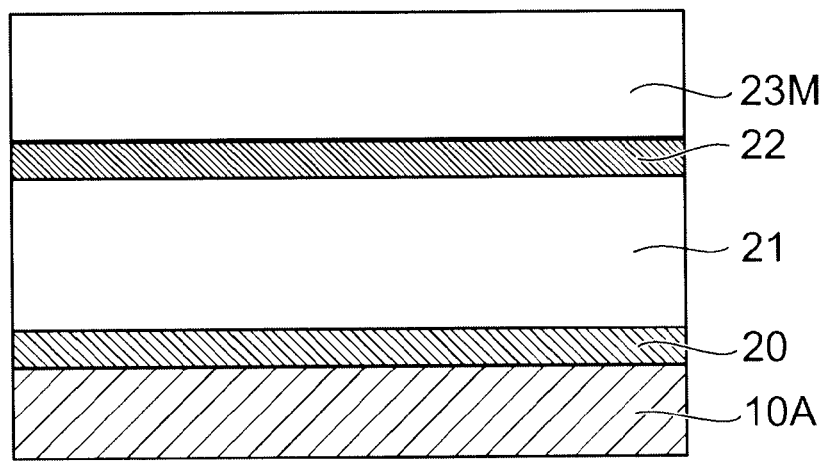
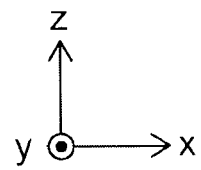
FIG. 4A
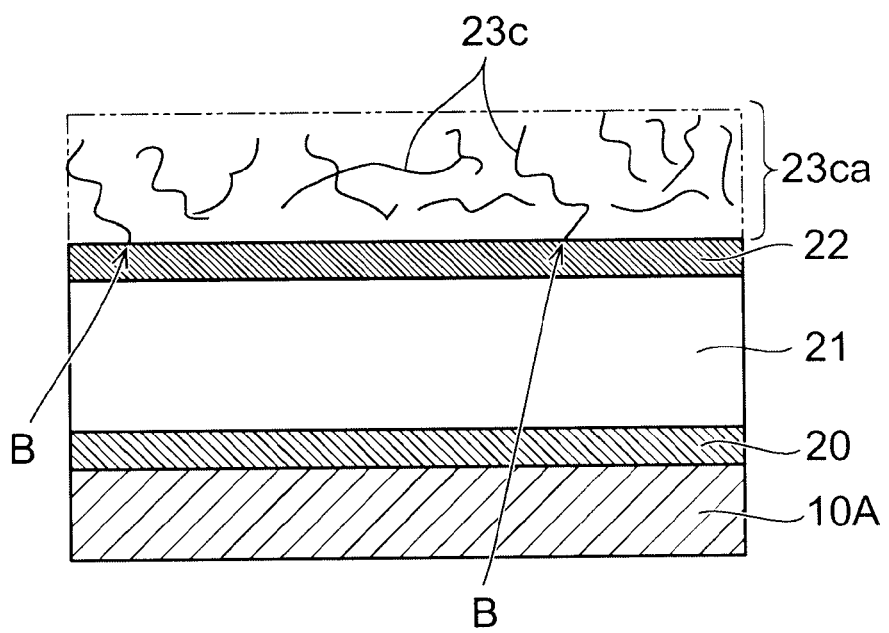
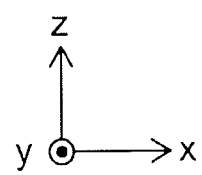
FIG. 4B

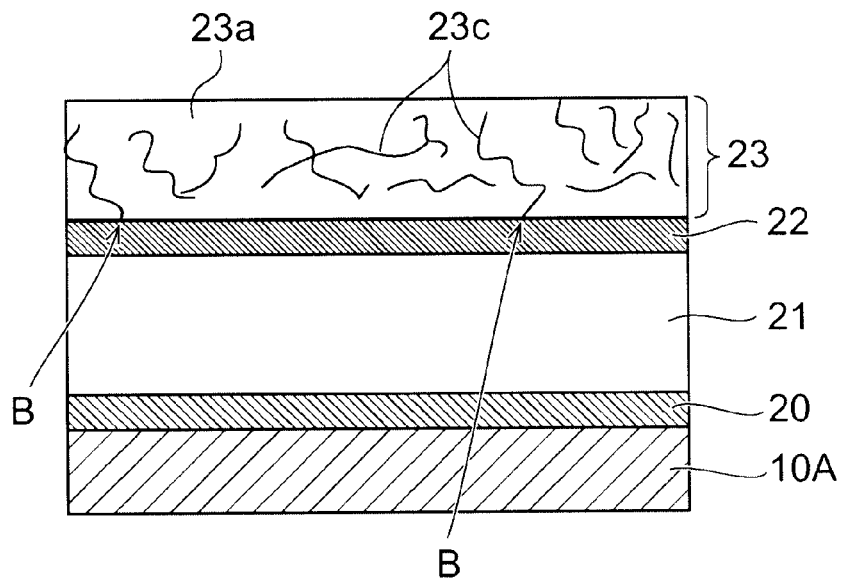
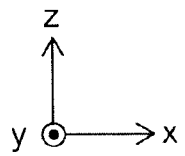
FIG. 5A
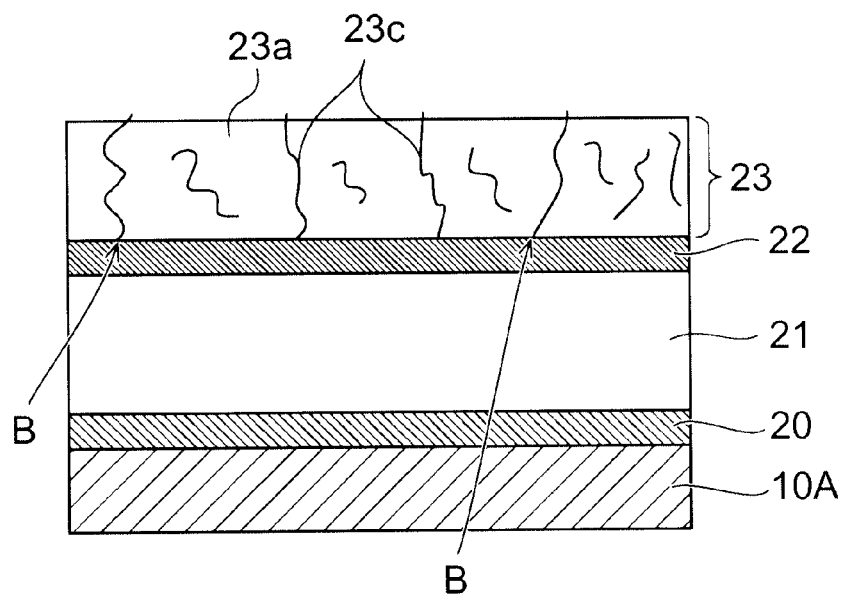
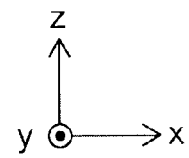
FIG. 5B

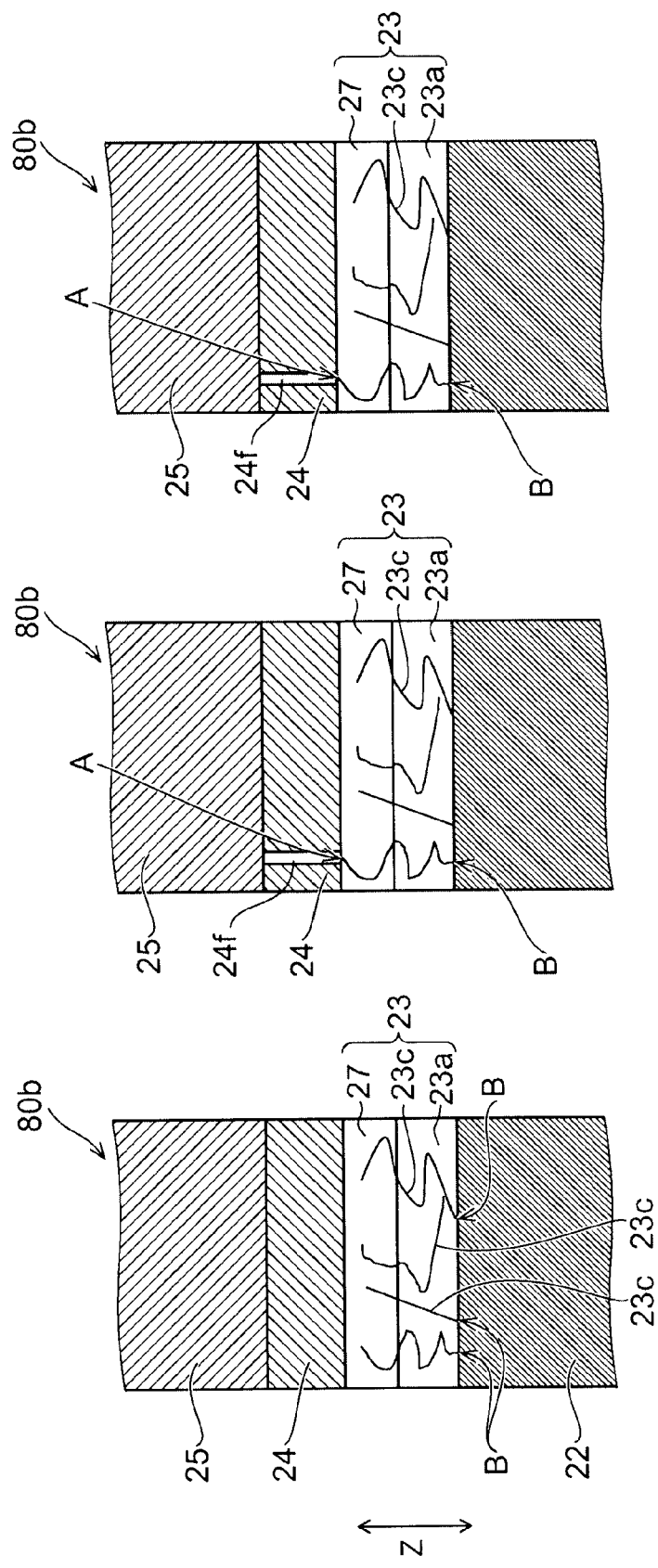

NONVOLATILE MEMORY DEVICE AND METHOD FOR MANUFACTURING SAME

CROSS-REFERENCE TO RELATED APPLICATIONS

This application is based upon and claims the benefit of priority from the prior Japanese Patent Application No.2009-219625, filed on Sep. 24, 2009; the entire contents of which are incorporated herein by reference.

FIELD

Embodiments described herein relate generally to a nonvolatile memory device and a method for manufacturing the same.

BACKGROUND

Nonvolatile memories, such as NAND flash memories, are widely used for high-capacity data storage in cellular phones, digital still cameras, USB (Universal Serial Bus) memories, silicon audio players and the like. Furthermore, novel applications have also been fast emerging, causing demand for downscaling and manufacturing cost reduction thereof. In particular, in a NAND flash memory, a plurality of active areas (A.A.) share a gate conductor (G.C.), thereby effectively realizing cross-point cells. Because of its simple structure, rapid downscaling and manufacturing cost reduction are in progress. However, a NAND flash memory is based on the operation of a transistor which records information using its threshold variation, and reportedly has limitations on further improvement in characteristics uniformity, reliability, operating speed, and integration density.

In this context, for instance, phase change memory elements and resistance change memory elements are based on the variable resistance state of resistance materials, and hence need no transistor operation in the write/erase operation. Thus, further improvement is expected in characteristics uniformity, reliability, operating speed, and integration density.

BRIEF DESCRIPTION OF THE DRAWINGS

FIGS. 3A to 3D are principal views illustrating the operation of the memory cell;

FIGS. 4A to 8 illustrate the process for manufacturing the memory cell;

FIGS. 10A to 10C are principal schematic views of a memory cell section of a nonvolatile memory device.

DETAILED DESCRIPTION

The embodiments will now be described with reference to the drawings.

In general, according to one embodiment, a nonvolatile memory device includes a memory cell. The memory cell is connected to a first interconnection and a second interconnection and includes a plurality of layers. The plurality of layers includes a memory layer and a carbon nanotube-containing layer which is in contact with the memory layer and contains a plurality of carbon nanotubes.

According to another embodiment, a method for manufacturing a nonvolatile memory device including a memory cell connected to a first interconnection and a second interconnection is disclosed. The method can include forming a carbon nanotube-containing layer containing a plurality of carbon nanotubes above the first interconnection. The method can cause an end of at least one carbon nanotube of the plurality of carbon nanotubes to appear on a surface of the carbon nanotube-containing layer. In addition, the method can form a memory layer on the carbon nanotube-containing layer.

First Embodiment

Figure 1A:
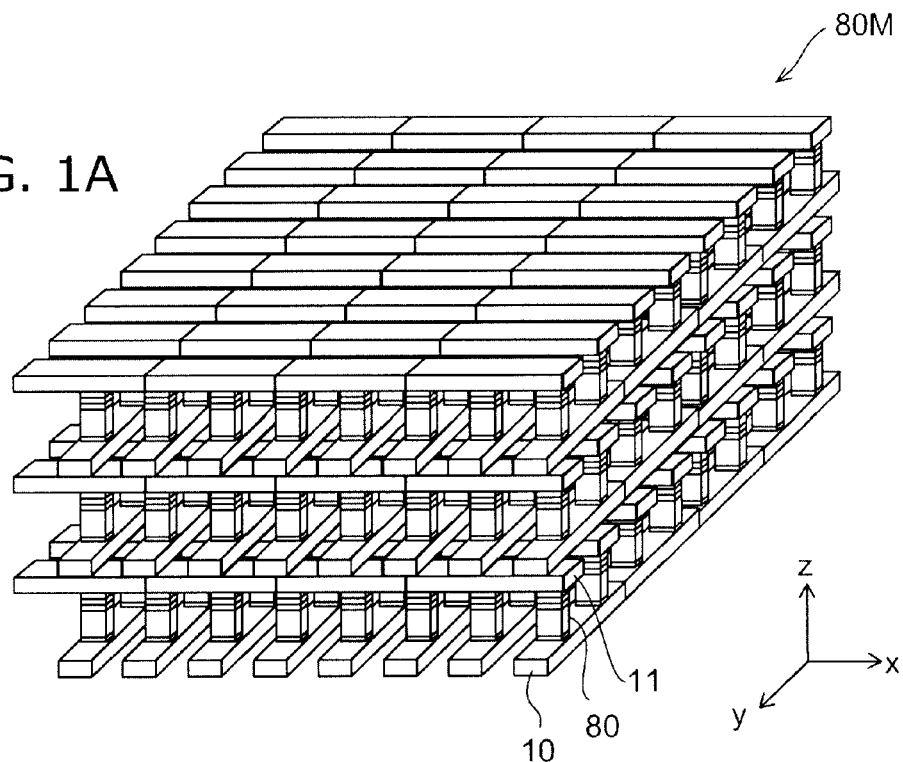
FIGS. 1A and 1B are principal schematic views of a memory cell section of a nonvolatile memory device.
Figure 1B:
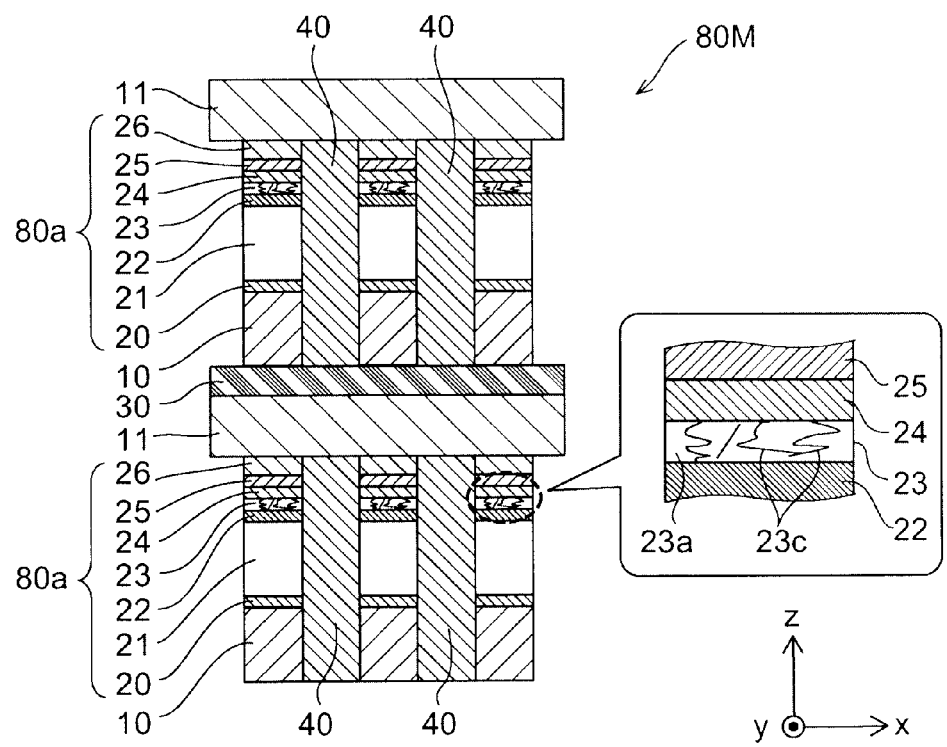

FIGS. 1A and 1B are principal schematic views of a memory cell section of a nonvolatile memory device. FIG. 1A is a principal schematic perspective view of the memory cell section, and FIG. 1B is a sectional view of a memory cell (memory unit element) 80a provided at the crossing position of a lower interconnection (bit line, BL) 10 and an upper interconnection (word line, WL) 11 of FIG. 1A.

As shown in FIG. 1A, a memory section 80M of the nonvolatile memory device includes lower interconnections 10 and upper interconnections 11 sandwiching memory cells 80a. The upper interconnections 11 extend in a first direction (X-axis direction in the figures) and are periodically arranged in a second direction (Y-axis direction in the figures). The lower interconnections 10 extend in the second direction (Y-axis direction in the figures) non-parallel to the first direction and are periodically arranged in the first direction. The memory cell 80a lies between the lower interconnection 10 and the upper interconnection 11 (at the cross-point position) crossing each other. The memory density of the nonvolatile memory device can be increased by stacking the lower interconnections 10, the upper interconnections 11, and the memory cells 80a in the Z-axis direction in the figures.

As shown in FIG. 1B, with the lower interconnection 10 used as a foundation, the memory cell 80a includes, from bottom to top, a metal film 20, a diode layer 21, a metal film 22, a layer containing carbon nanotubes (carbon nanotube-containing layer, hereinafter CNT-containing layer) 23, a resistance change film 24 as a memory layer, and a metal film 25. Here, the CNT-containing layer 23 contains carbon nanotubes with electrical conductivity. It functions as an electrode of the resistance change film 24 because carbon nanotubes are in contact with the resistance change film 24. The resistance change film 24 functions as a memory layer.

A stopper interconnection film 26 for CMP (chemical mechanical polishing) is placed on the metal film 25. The stopper interconnection films 26 in the respective memory cells 80a are connected to each other by the upper interconnection 11. In each memory cell 80a, the diode layer 21, the CNT-containing layer 23, and the resistance change film 24 are connected in series so that a current flows in one direction in the memory cell 80a.

An interlayer insulating film 30 is provided on the upper interconnection 11. On this interlayer insulating film 30, the lower interconnection 10, the memory cell 80a, and the upper interconnection 11 described above are repetitively stacked.

Thus, the memory section 80M has a structure in which the set of the lower interconnection 10, the memory cell 80a, and the upper interconnection 11 is stacked in a plurality of stages. An element isolation layer 40 is provided between the adjacent memory cells 80a to ensure insulation between the memory cells 80a. The width of the memory cells 80a is 100 nm or less. In the embodiments, unless otherwise specified, the "width" of a member refers to the diameter of the cross section of the member cut generally perpendicular to the Z-axis direction.

Through the lower interconnection 10 and the upper interconnection 11 of the memory section 80M like this, a voltage is applied to the desired resistance change film 24, and a current flows in the resistance change film 24. Then, the resistance change film 24 reversibly transitions between a first state and a second state. For instance, depending on the combination of potentials applied to the lower interconnection 10 and the upper interconnection 11, the voltage applied between the major surfaces of the resistance change film 24 changes, and the resistance of the resistance change film 24 reversibly transitions between the first state and the second state. This makes it possible to store digital information (such as "0" or "1") in the memory cell 80a, and to erase digital information from the memory cell 80a. For instance, it is possible to write data with the high resistance state "0" and the low resistance state "1". In this case, writing from "0" to "1" is referred to as "set operation", and writing from "1" to "0" is referred to as "reset operation".

The material of the resistance change film 24 can illustratively be a variable resistance material whose resistance can reversibly transition, or a phase change material which can reversibly transition between the crystalline state and the amorphous state, in response to the applied voltage.

For instance, the material includes at least one selected from $ZnMn_xO_y$, $ZnFe_xO_y$, $NbO_x$, Cr-doped $SrTiO_{3-x}$, $Pr_xCa_yMnO_z$, $ZrO_x$, $NiO_x$, Ti-doped $NiO_x$ film, $ZnO_x$, $TiO_x$, $TiO_xN_y$, $CuO_x$, $GdO_x$, $CuTe_x$, $HfO_x$, $HfAlO_x$, CVD-C (carbon), CN (carbon nitride), and chalcogenide-based GST ($Ge_xSb_yTe_z$), doped GST such as N-doped GST and O-doped GST, $Ge_xSb_y$, $In_xGe_yTe_z$ and the like, which change the resistance state by Joule's heat generated by the voltage applied thereacross.

The CNT-containing layer 23 can be a layer in which CNTs 23c are dispersed in an insulating film 23a. The insulating film 23a can be an oxide film of one of silicon oxide ($SiO_2$), alumina ($Al_2O_3$), silicon carbide oxide (SiOC), magnesium oxide (MgO) and the like, or an organic insulating film. The insulating film 23a may be a high-k material or low-k material. Here, the CNT 23c may be a single-wall nanotube (SWNT) made of a single layer, or a multi-wall nanotube (MWNT) made of multiple layers. For SWNTs, the diameter of the CNT 23c is approximately 2 nm.

The material of the lower interconnection 10, the upper interconnection 11, and the stopper interconnection film 26 can illustratively be tungsten (W), which is superior in high-temperature heat resistance and has low resistivity. The material of the lower interconnection 10, the upper interconnection 11, and the stopper interconnection film 26 may also be tungsten nitride (WN), tungsten carbide (WC), titanium (Ti), titanium nitride (TiN) and the like.

The material of the metal film 20, 22, 25 can illustratively be titanium (Ti), titanium nitride (TiN), platinum (Pt) and the like.

The diode layer 21 is illustratively a rectifying element primarily composed of polysilicon (poly-Si), and can be a PIN diode, PN junction diode, Schottky diode, Zener diode and the like. Besides silicon, the material of the diode layer 21 may be a combination of semiconductor materials such as germanium (Ge), and metal oxide semiconductor materials such as NiO, TiO, CuO, and InZnO.

To ensure stable ohmic contact between the metal film 20, 22 and the diode layer 21, a layer made of components different from those of the metal film 20, 22 may be provided at the interface between the metal film 20, 22 and the diode layer 21. This layer is illustratively a metal silicide film. The metal silicide film is formed by performing annealing treatment on the metal film 20, 22 and the diode layer 21.

To efficiently heat the resistance change film 24 in the reset operation, a heat sink layer (not shown) may be provided near the resistance change film 24.

Thus, the memory section 80M of the nonvolatile memory device has a ReRAM (resistance random access memory) cell array structure of the cross-point type.

Figure 2:
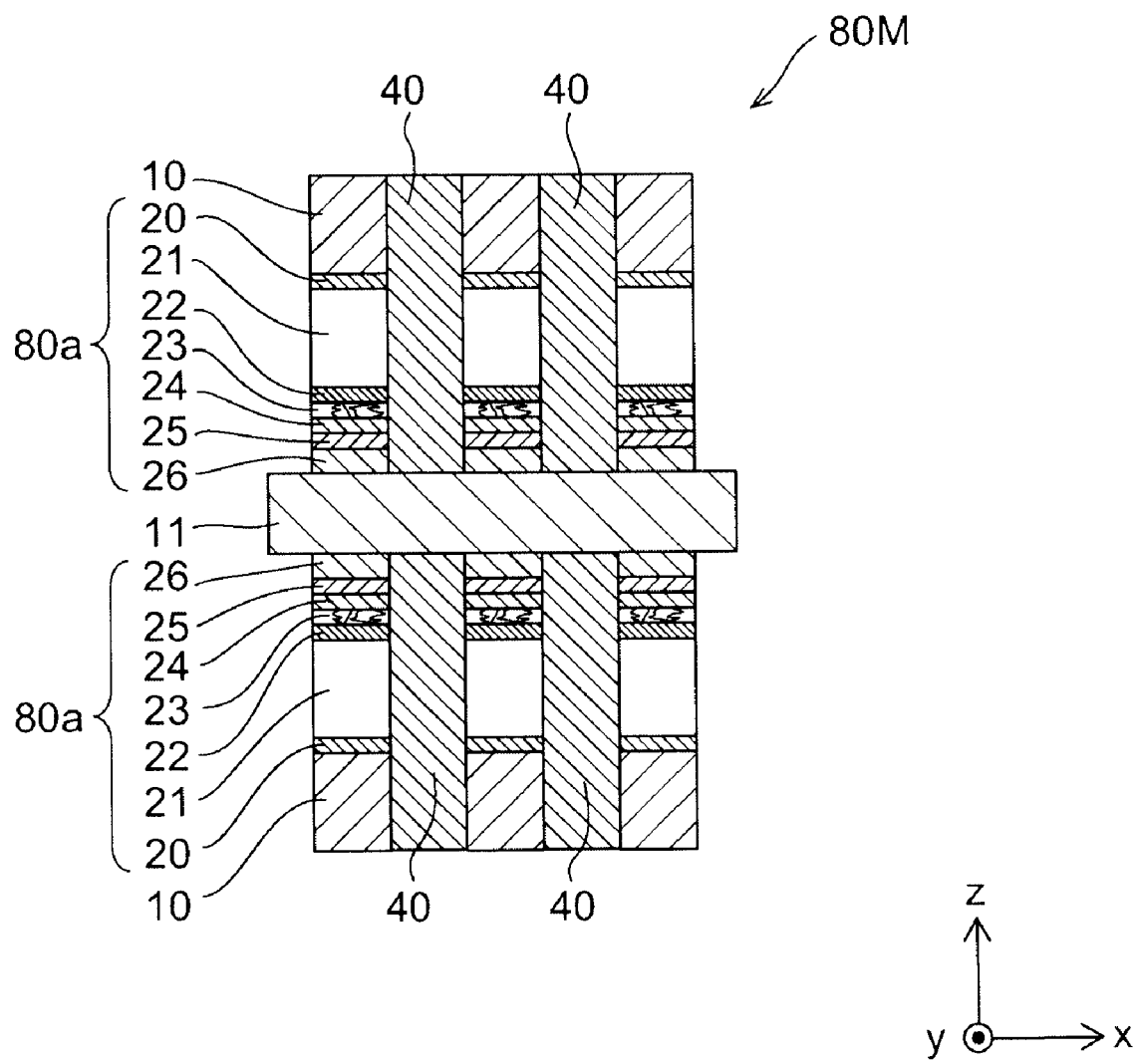
FIG. 2 is a principal schematic view of the memory cell section of the nonvolatile memory device.

Besides the ReRAM cell array structure shown in FIG. 1A, the memory section 80M may have a structure shown in FIG. 2.

FIG. 2 is a principal schematic view of a memory cell section of a nonvolatile memory device.

In the ReRAM memory cell array shown in FIG. 2, the upper interconnection 11 as a word line is provided not for each stage, but is shared by the memory cells 80a placed above and below this upper interconnection 11.

For instance, with respect to the upper interconnection 11 in the figure taken as the axis of symmetry, the memory cell 80a below the upper interconnection 11 and the memory cell 80a above the upper interconnection 11 are placed axisymmetrically.

In addition to increasing the memory density, by the sharing of the upper interconnection 11, such a structure can suppress the delay of voltage application to the upper interconnection 11, accelerate the write operation and erase operation, and reduce the element area, for instance.

Thus, the nonvolatile memory device of this embodiment includes the upper interconnections 11 extending in the X-axis direction, the lower interconnections 10 extending in the Y-axis direction non-parallel to the X-axis direction, and the memory cells 80a each provided at the crossing position of the upper interconnection 11 and the lower interconnection 10. The memory cell 80a is made of a plurality of stacked films, including a memory layer and a layer containing CNTs (CNT-containing layer 23) in contact with the memory layer.

The CNT-containing layer is a layer in which a plurality of the CNTs 23c are dispersed in the insulating film 23a. One end of at least one carbon nanotube 23c of the plurality of the carbon nanotubes 23c is in contact with the memory layer, and the other end is electrically connected to the lower interconnection 10.

The operation of the memory cell 80a is described.

FIGS. 3A to 3D are principal views illustrating the operation of the memory cell.

FIG. 3A shows the initial state of the memory cell 80a. For instance, it represents a stacked film of the metal film 22, CNT-containing layer 23, resistance change film 24, and metal film 25 provided in this order between the lower interconnection 10 and the upper interconnection 11 described above. Hence, when a voltage is applied between the lower interconnection 10 and the upper interconnection 11, the potential of the lower interconnection 10 is conducted to the CNT-containing layer 23 through the metal film 22, and the potential of the upper interconnection 11 is conducted to the resistance change film 24 through the metal film 25. At least one of the CNTs 23c in the CNT-containing layer 23 is in contact with the resistance change film 24 and the metal film 22. Thus, the resistance change film 24 and the metal film 22 are brought into continuity through the CNT 23c in contact therewith. That is, the resistance change film 24 and the metal film 22 are electrically connected to each other through at least one of the plurality of the CNTs 23c.

In FIGS. 3A to 3C, by way of example, the site where the end of the CNT 23c is in contact with the resistance change film 24 is labeled as "portion A", and the site where the end of the CNT 23c is in contact with the metal film 22 is labeled as "portion B".

Next, a voltage for performing forming is applied between the metal film 22 and the metal film 25. Thus, a filament 24f in the low resistance state is formed in the resistance change film 24 starting at the portion A where the CNT 23c is in contact with the resistance change film 24.

This state is shown in FIG. 3B.

For instance, FIG. 3B illustrates the case where there are a plurality of portions A, showing the state in which a filament 24f extends from each portion A vertically in the resistance change film 24. The filament 24f in the low resistance state is formed in the resistance change film 24, which means that information "1", for instance, is written to the memory cell 80a.

Next, the reset operation is performed on the memory cell 80a. As shown in FIG. 3B, the filament 24f at the portion A before the reset operation is in the state of lower resistance than the resistance change film 24 except the portion A. Hence, the current flows preferentially in each filament 24f. By this reset operation, the filament 24f at the portion A changes from the low resistance state to the high resistance state "0". That is, the information "1" in the memory cell 80a turns into information "0", which means that the information is erased from the memory cell 80a.

This state is shown in FIG. 3C.

Next, when the set operation is performed on the memory cell 80a, the filament 24f at each portion A preferentially changes from the high resistance state "0" to the low resistance state "1".

Before the set operation, the filament 24f at the portion A is in the high resistance state "0" as shown in FIG. 3C.

If the resistance of the filament 24f is lower than the resistance of the resistance change film 24 except the portion A, the resistance of the filament 24f is relatively lower than the resistance of the resistance change film 24 except the portion A. Hence, by the set operation, the current flows preferentially in the filament 24f at each portion A.

On the other hand, even if the resistance of the filament 24f before the set operation becomes higher than that in the initial high resistance state, the current flows preferentially in the filament 24f at each portion A. This is because the CNT 23c is in direct contact with the filament 24f, and hence the electric field in the filament 24f portion is higher than the electric field in the resistance change film 24 except the portion A. Here, the state after the set operation is the same as shown in FIG. 3B.

Thus, by the set operation, the filament 24f at each portion A preferentially changes from the high resistance state "0" to the low resistance state "1". Furthermore, by the reset operation, the filament 24f at each portion A preferentially changes from the low resistance state "1" to the high resistance state "0". In other words, in the memory cell 80a, the filament 24f at the portion A preferentially contributes to the memory switching (writing/erasure of information).

In the memory cell 80a like this, its power consumption is lower than in the case where the metal film 22 is in direct contact with the resistance change film 24.

For instance, the following result has been obtained from evaluation in the unipolar operation.

As evaluation samples, an evaluation sample a according to this embodiment and an evaluation sample b according to a comparative example were prepared.

The evaluation sample a has a structure as shown in FIG. 3A, in which the stacked film is composed of the metal film 22, CNT-containing layer 23, resistance change film 24, and metal film 25 in this order. In contrast, the evaluation sample b has a structure as shown in FIG. 3D, in which the stacked film is composed of the metal film 22, resistance change film 24, and metal film 25 in this order with no CNT-containing layer 23 interposed therein. Here, the material of the metal film 22, 25 is titanium nitride (TiN). The thickness of the metal film 22, 25 is 50 nm. The material of the resistance change film 24 is primarily composed of manganese oxide. The diameter (width) of the memory cell 80a is approximately 50 μmφ.

Here, by grounding the metal film 22 as the lower electrode and applying a positive voltage to the metal film 25 as the upper electrode, the aforementioned switching operation was performed on the evaluation samples a, b. The result was that the reset current for the evaluation sample a was approximately 1/10 of the reset current for the evaluation sample b.

The reason for the decrease of the reset current is considered that the interposition of the CNT-containing layer 23 between the metal film 22 and the resistance change film 24 decreases the effective area of the resistance change film 24. For instance, the effective area is reduced to 1/3 or less.

That is, in the evaluation sample a, the resistance change film 24 and the metal film 22 are in continuity through the CNT 23c in contact with the resistance change film 24. Thus, in the evaluation sample a, the filament 24f is selectively formed in the resistance change film 24 starting at the portion A where the CNT 23c is in contact therewith. Here, for SWNTs, the diameter of the CNT 23c is approximately 2 nm. Hence, in the evaluation sample a, the ultrathin filament 24f corresponding to the diameter of the CNT 23c is formed in the resistance change film 24.

In contrast, in the evaluation sample b, the entire major surface of the resistance change film 24 is in contact with the entire major surface of the metal film 22. Hence, in the evaluation sample b, the contact area between the resistance change film 24 and the metal film 22 is predominantly larger than in the evaluation sample a. In such a state, it is difficult to selectively form an ultrathin filament in the resistance change film 24. Furthermore, in the evaluation sample b, the number of filaments may be larger than in the evaluation sample a.

Thus, in the evaluation sample a according to this embodiment, the width of the filament 24f, or the number of filaments 24f, can be made smaller than in the evaluation sample b of the comparative example.

Furthermore, the reset current for the evaluation sample a according to this embodiment is reduced to approximately 1/10 of the reset current for the evaluation sample b according to the comparative example, and hence becomes lower than the forward current flowing in the diode layer 21. This eliminates the need to incorporate a high-performance diode layer in the memory cell 80a. Consequently, the process margin of the nonvolatile memory is improved. Furthermore, the cost of the nonvolatile memory is reduced.

A method for manufacturing the memory cell 80a is described.

FIGS. 4A to 8 illustrate the process for manufacturing the memory cell.

First, as shown in FIG. 4A, a planar (blanket) lower interconnection layer 10A is formed in an upper portion of a semiconductor substrate (not shown) primarily composed of silicon (Si), gallium arsenide (GaAs) or the like. Subsequently, on the lower interconnection layer 10A, a stacked film is formed in the order of the metal film 20, diode layer 21, and metal film 22. The lower interconnection layer 10A, metal film 20, diode layer 21, and metal film 22 are formed illustratively by the sputtering process or CVD process.

Next, a solution dispersed with the CNTs 23c made of a single layer is applied onto the metal film 22. The solvent can be an organic solvent (such as ethanol ($C_2H_5OH$)). Thus, a coating film 23M containing CNTs 23c and the organic solvent is formed on the metal film 22. At this time, at the interface between the coating film 23M and the metal film 22, a portion B occurs where one end of any one of the CNTs 23c is in contact with the metal film 22.

Next, as shown in FIG. 4B, the coating film 23M is heated to evaporate (vaporize) the organic solvent. Thus, the organic solvent is removed from the coating film 23M, and a layer 23ca dispersed with only a plurality of the CNTs 23c is formed on the metal film 22. The CNTs 23c are separated from each other by a given spacing above the metal film 22.

Next, as shown in FIG. 5A, the insulating film 23a is buried among the CNTs 23c by using plasma CVD to form the CNT-containing layer 23. The insulating film 23a is formed to the extent that the CNTs 23c are covered with the insulating film 23a.

Next, as shown in FIG. 5B, under a low temperature condition, the upper surface side of the insulating film 23a is exposed to a dilute hydrofluoric acid solution or hydrofluoric acid vapor and thereby etched back. By this etch-back, the other end of at least one CNT 23c appears from the surface of the insulating film 23a.

Figure 6A:
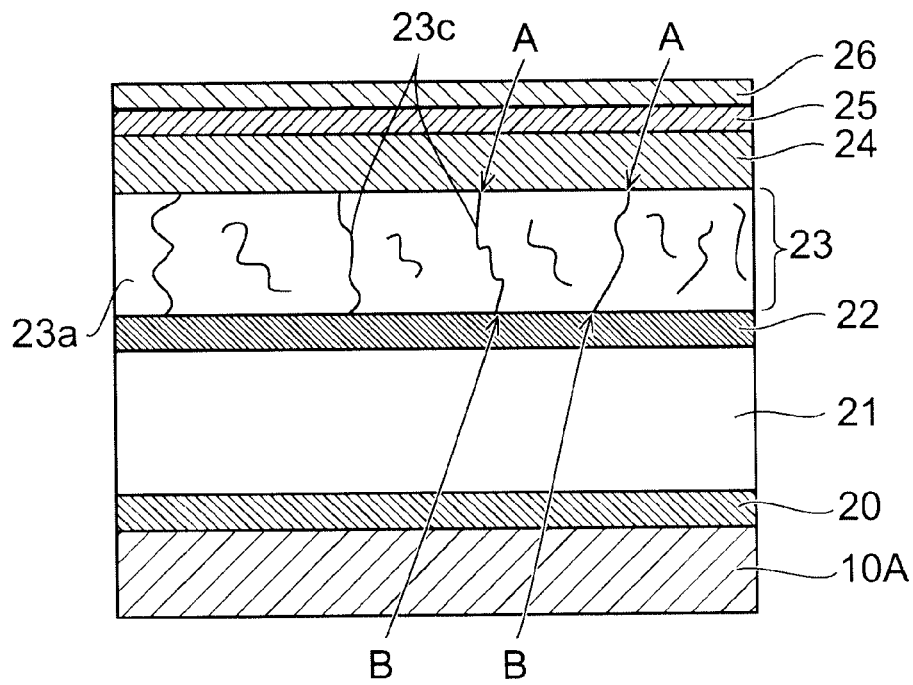

Next, as shown in FIG. 6A, the resistance change film 24 is formed on the CNT-containing layer 23. Thus, the plurality of the CNTs 23c are formed in contact with the resistance change film 24 at the portions A and in contact with the metal film 22 at the portions B.

Subsequently, on the resistance change film 24, a stacked film is formed in the order of the metal film 25 and stopper interconnection film 26. The resistance change film 24, metal film 25, and stopper interconnection film 26 are formed illustratively by the sputtering process or CVD process.

Figure 6B:
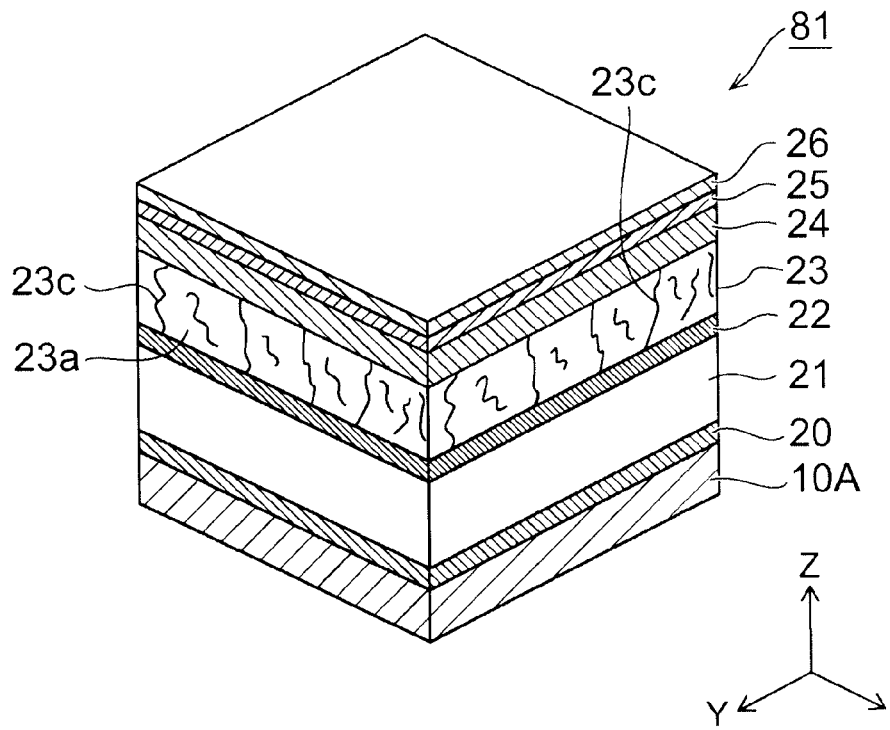

A stacked structure 81 formed up to this step is shown in FIG. 6B as a schematic perspective view.

Figure 7A:
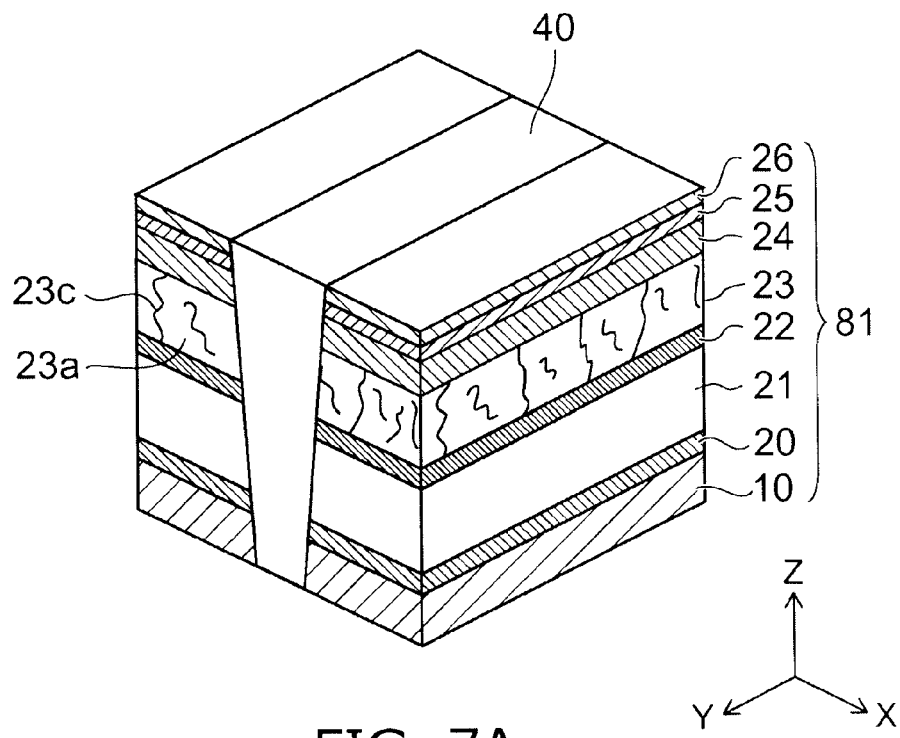
Figure 7B:
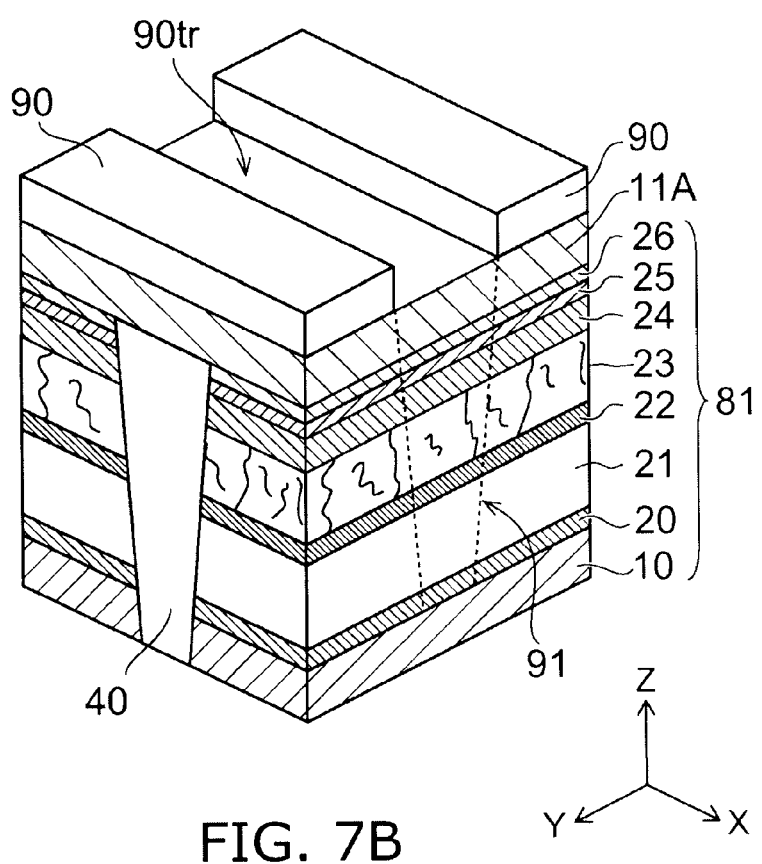

Next, selective etching processing (not shown) is performed on the stacked structure 81 shown in FIG. 6B. Furthermore, an insulating film (element isolation layer) is buried in the etched portion to form the element isolation layer 40 in the stacked structure 81 as shown in FIG. 7A. The element isolation layer 40 extends in the Y-axis direction. At this time, the lower interconnections 10 extending in the Y-axis direction are formed in the lowermost layer of the stacked structure 81. Next, as shown in FIG. 7B, a planar (blanket) upper interconnection layer 11A is formed on the stacked structure 81. The upper interconnection layer 11A is formed illustratively by the sputtering process or CVD process. Subsequently, a mask member (oxide film) 90 is patterned on the upper interconnection layer 11A.

A groove portion 90tr extending in the X-axis direction is formed between the portions of this mask member 90. That is, the extending direction of the groove portion 90tr is generally perpendicular to the extending direction of the lower interconnection 10. The upper interconnection layer 11A appears from the bottom of the groove portion 90tr.

Subsequently, the stacked structure 81 located below the groove portion 90tr is selectively removed by etching. For instance, the portion appearing from the groove portion 90tr is removed by etching from the upper interconnection layer 11A down to the metal film 20. Thus, the portion of the stacked structure 81 indicated by a dotted line 91 is removed. Subsequently, the element isolation layer 40 is buried in this removed portion. The mask member 90 is removed by CMP.

Figure 8:
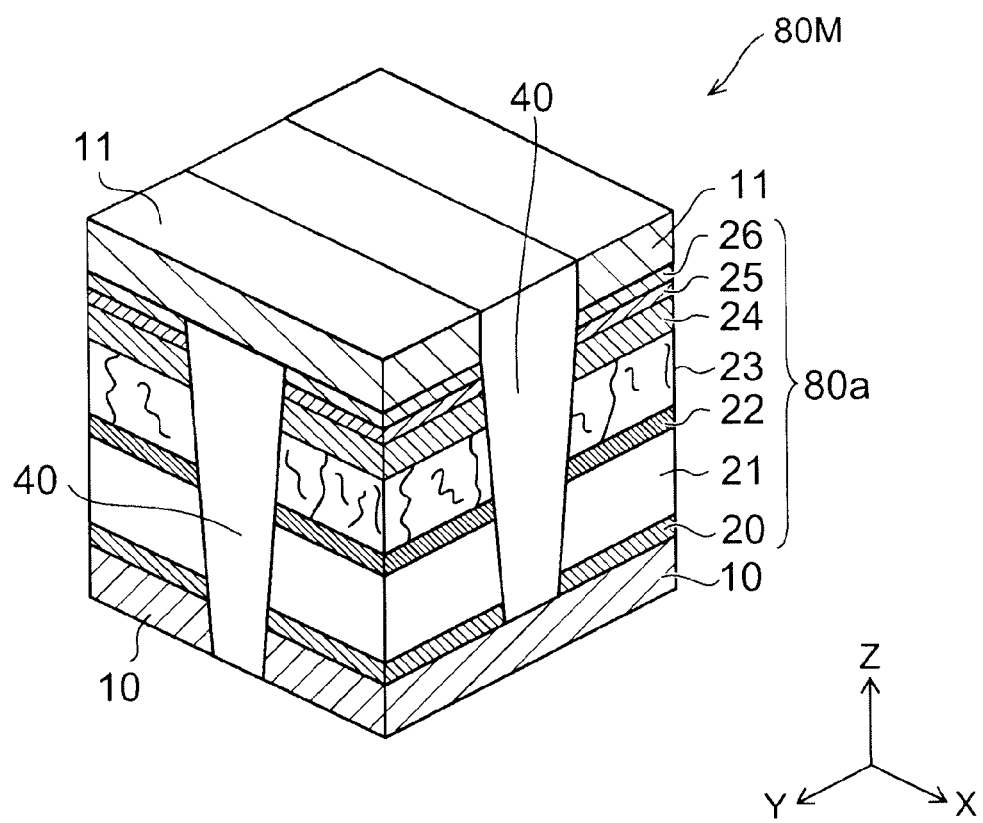

By such a manufacturing process, the memory section 80M of the first embodiment shown in FIG. 8 is formed. As shown, the memory cell 80a is provided at the crossing position of the lower interconnection 10 and the upper interconnection 11. The memory cell 80a shown in FIG. 8 corresponds to the memory cell 80a shown in FIG. 1B.

Figure 9:
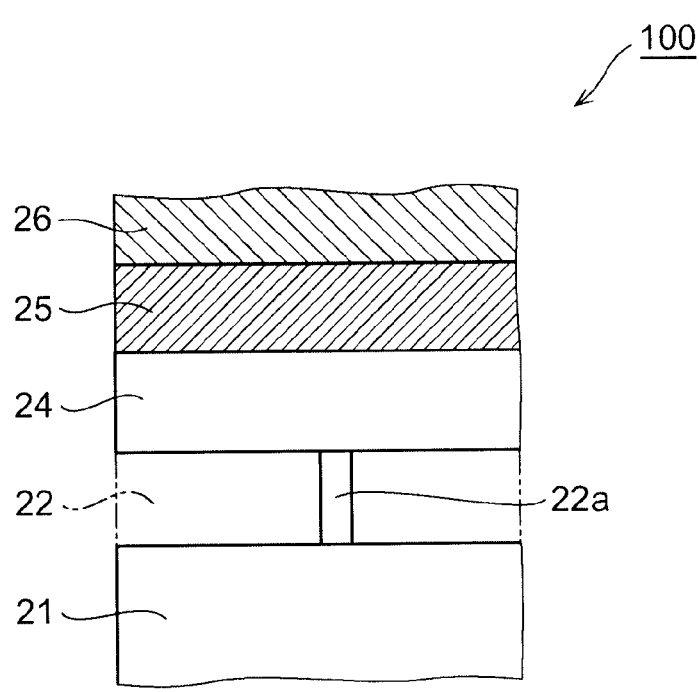
FIG. 9 illustrates a comparative example of a memory cell.

Here, it may be contemplated that an ultrathin filament can be formed in the resistance change film 24 by providing a metal layer 22a, in which the metal film 22 itself is made ultrathin, immediately below the resistance change film 24 as in a comparative example 100 shown in FIG. 9. In the comparative example 100 like this, it may be contemplated that because the metal layer 22a itself is ultrathin, an ultrathin filament corresponding to the width (thinness) of the metal layer 22a is formed in the resistance change film 24.

However, it is difficult to approximate the width of the metal layer 22a to the nanometer order by the normal wafer process (such as film formation and photolithography technique). In particular, as the width of the metal layer 22a becomes narrower, it is more difficult to control the width. Furthermore, as the width of the metal layer 22a becomes narrower, variation is more likely to occur in the width of the metal layer 22a in each memory cell. Moreover, if the ultrathin metal layer 22a is formed during the wafer process, the mechanical strength of the metal layer 22a itself becomes weak, and the metal layer 22a itself may be broken. This makes it difficult to stably operate the memory cell in the comparative example 100.

In contrast, in this embodiment, the stacked structure of the metal film 22, CNT-containing layer 23, resistance change film 24, and metal film 25 is formed by a simple method. Thus, the memory cell 80a with low power consumption and high productivity is formed.

Because the plurality of CNT 23c have high conductivity and high heat resistance, damages to the resistance change film 24 and a rectifying element (diode layer 21) due to heat generation are reduced as compared with a case where a current having the same current value is applied to the metal layer 22a.

Actually, the CNTs 23c dispersed in the insulating film 23a may be in contact with each other. Hence, the current path between the metal film 22 and the resistance change film 24 may be formed through a CNT 23c in contact with the resistance change film 24 at the portion A (see FIGS. 3A to 3C) and another CNT in contact with this CNT 23c.

However, also in such cases, there is no difference in the fact that the CNT 23c is in contact with the resistance change film 24 at a pinpoint portion A. Thus, the power consumption is significantly reduced. This applies also to the embodiment described below.

Next, a variation of the first embodiment is described. In the figures illustrated below, the same members as those in the first embodiment are labeled with like reference numerals, and the detailed description thereof is omitted as appropriate.

Second Embodiment

A second embodiment is described.

FIGS. 10A to 10C are principal schematic views of a memory cell section of a nonvolatile memory device. Besides the principal structure of a memory cell 80b, FIGS. 10A to 10C also illustrate the operation of the memory cell 80b. FIG. 10A shows the initial state of the memory cell 80b.

As shown in FIG. 10A, the memory cell 80b includes the metal film 22, the CNT-containing layer 23, the resistance change film 24, and the metal film 25. The CNT-containing layer 23 includes a gap (interstice) 27 with respect to the resistance change film 24. The stacked structure composed of the metal film 22, CNT layer 23, resistance change film 24, and metal film 25 is provided at the crossing position of the lower interconnection 10 and the upper interconnection 11 described above.

Here, the CNT-containing layer 23 contains conductive CNTs 23c extending into the gap 27 and being in contact with the resistance change film 24, and hence functions as an electrode of the resistance change film 24. The gap 27 is a space having a thickness of 50 nm or less. The memory cell 80b is the same as the memory cell 80a except the stacked structure composed of the metal film 22, CNT-containing layer 23, resistance change film 24, and metal film 25.

The operation of the memory cell 80b is described.

A voltage for performing forming is applied between the metal film 22 and the metal film 25. At this time, by the electrostatic force or van der Waals force, the tip of the CNTs 23c is attracted toward the resistance change film 24, and at least one of the CNTs 23c is brought into contact with the resistance change film 24. This contact portion is referred to as portion A.

This state is shown in FIG. 10B.

The moment the CNT 23c is brought into contact with the resistance change film 24, the lower interconnection 10 and the upper interconnection 11 are brought into continuity. Hence, apparently, the resistance change film 24 changes from the high resistance state to the low resistance state. Furthermore, once the tip of the CNT 23c is brought into contact with the resistance change film 24, the tip of the CNT 23c and the resistance change film 24 maintain the contact state by the van der Waals force.

Subsequently, when a voltage is applied between the metal film 22 and the metal film 25, the filament 24f in the low resistance state is formed in the resistance change film 24 starting at the portion A where the CNT 23c is in contact with the resistance change film 24. For instance, as shown in FIG. 10B, the filament 24f extending vertically in the resistance change film 24 from the portion A is formed.

FIG. 10B illustrates the case where there is one portion A, and shows a configuration in which the filament 24f extends vertically in the resistance change film 24 from this portion A. The filament 24f in the low resistance state is formed in the resistance change film 24, which means that information "1", for instance, is written to the memory cell 80b.

The CNTs 23c except the CNT 23c which has been brought into contact are unlikely to be in contact with the resistance change film 24. This is because once the filament 24f is selectively brought into contact with the resistance change film 24 at the portion A, for instance, the intensity of electric field outside the portion A becomes lower (weaker) than in the portion A.

Next, the reset operation is performed on the memory cell 80b. As shown in FIG. 10B, the filament 24f at the portion A before the reset operation is in the state of lower resistance than the resistance change film 24 except the portion A. Hence, the current flows preferentially in each filament 24f. By this reset operation, the filament 24f at the portion A changes from the low resistance state to the high resistance state "0". That is, the information "1" in the memory cell 80b turns into information "0", which means that the information is erased from the memory cell 80b.

This state is shown in FIG. 10C.

Subsequently, when the set operation is performed on the memory cell 80b, the filament 24f at each portion A preferentially changes from the high resistance state "0" to the low resistance state "1".

Before the set operation, the filament 24f at the portion A is in the high resistance state "0" as shown in FIG. 10C.

If the resistance of the filament 24f is lower than the resistance of the resistance change film 24 except the portion A, the resistance of the filament 24f is relatively lower than that of the resistance change film 24 except the portion A. Hence, by the set operation, the current flows preferentially in the filament 24f at each portion A.

On the other hand, even if the resistance of the filament 24f before the set operation becomes higher than that in the initial high resistance state, the current flows preferentially in the filament 24f at each portion A. This is because the CNT 23c is in direct contact with the filament 24f, and hence the electric field in the filament 24f portion is higher than the electric field in the resistance change film 24 except the portion A. The state after the set operation is the same as shown in FIG. 10B.

Thus, by the set operation, the filament 24f at each portion A preferentially changes from the high resistance state "0" to the low resistance state "1". Furthermore, by the reset operation, the filament 24f at each portion A preferentially changes from the low resistance state "1" to the high resistance state "0". In the memory cell 80b, the filament 24f at the portion A preferentially contributes to the memory switching (writing/erasure of information).

In the memory cell 80b like this, its power consumption is lower than in the case where the metal film 22 is in direct contact with the resistance change film 24. In particular, in the memory cell 80b, by the forming operation, the tip of at least one CNT 23c is attracted toward the resistance change film 24 and brought into contact with the resistance change film 24. Thus, the number of portions A in the memory cell 80b is smaller than the number of portions A in the memory cell 80a. Hence, in the memory cell 80b, the effective area of the resistance change film 24 is smaller than in the memory cell 80a. Thus, the set current and the reset current for the memory cell 80b are lower than the set current and the reset current for the memory cell 80a.

In a preferable structure for minimizing the set current and the reset current for the memory cell 80b, there is only one portion A, and only one CNT 23c is in contact with the resistance change film 24.

A method for manufacturing the memory cell 80b is described.

FIGS. 11A to 14 illustrate the process for manufacturing the memory cell.

In the manufacturing process of the second embodiment, the manufacturing process of FIGS. 4A to 5B described above is the same. Hence, the second embodiment is described from the manufacturing step subsequent thereto. It is noted that in the second embodiment, the etch-back step shown in FIG. 5B removes the upper surface side of the insulating film 23a more deeply than in the first embodiment. For instance, the depth of etch-back is taken to be 15 nm or less. By such etch-back, the end of at least one CNT 23c appears from the upper surface side of the insulating film 23a.

Figure 11A:
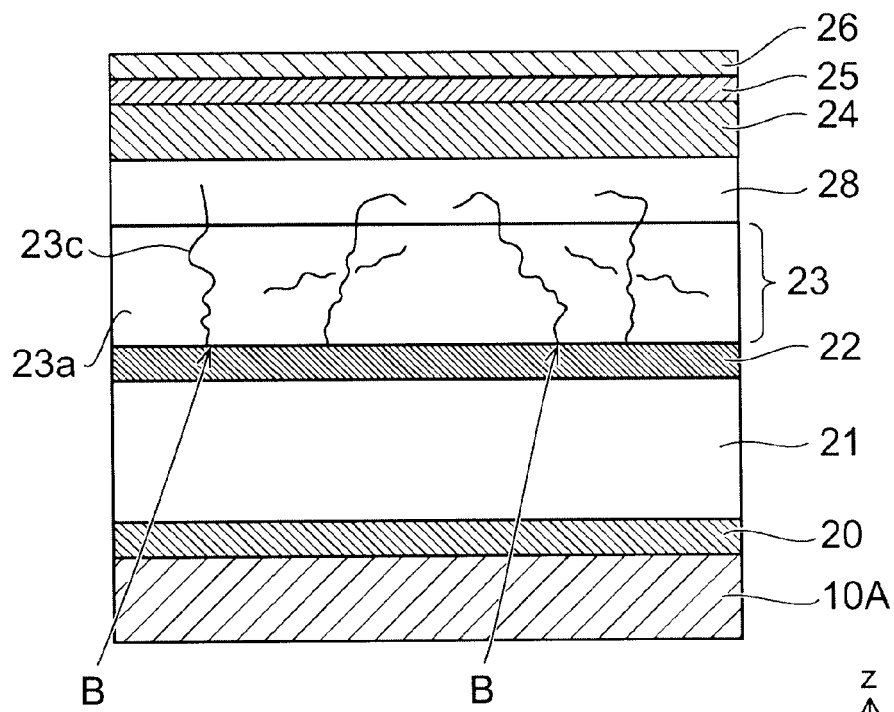
FIGS. 11A to 14 illustrate the process for manufacturing the memory cell.

Next, as shown in FIG. 11A, an organic coating 28 such as a resist is formed on the CNT-containing layer 23 by a coating process. The thickness of the organic coating 28 is 50 nm or less. At this time, the CNTs 23c appearing from the surface of the CNT-containing layer 23 are buried in the organic coating 28.

Subsequently, the resistance change film 24 is formed on the organic coating 28 by the sputtering process or CVD process.

Subsequently, on the resistance change film 24, a stacked film is formed in the order of the metal film 25 and stopper interconnection film 26. The resistance change film 24, metal film 25, and stopper interconnection film 26 are formed illustratively by the sputtering process or CVD process.

Figure 11B:
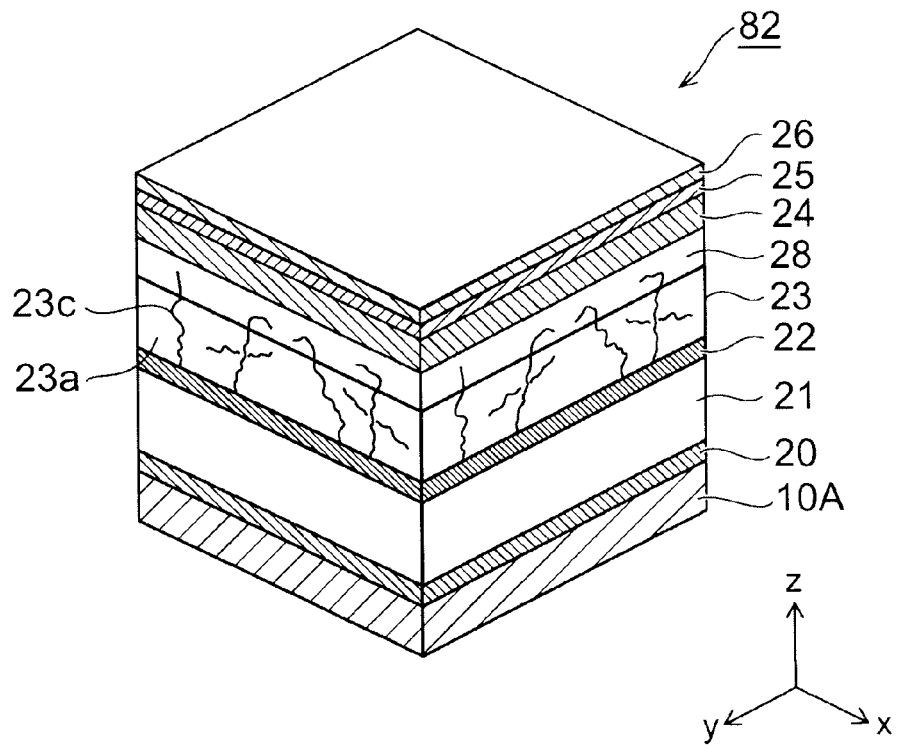

A stacked structure 82 formed up to this step is shown in FIG. 11B as a schematic perspective view.

Figure 12A:
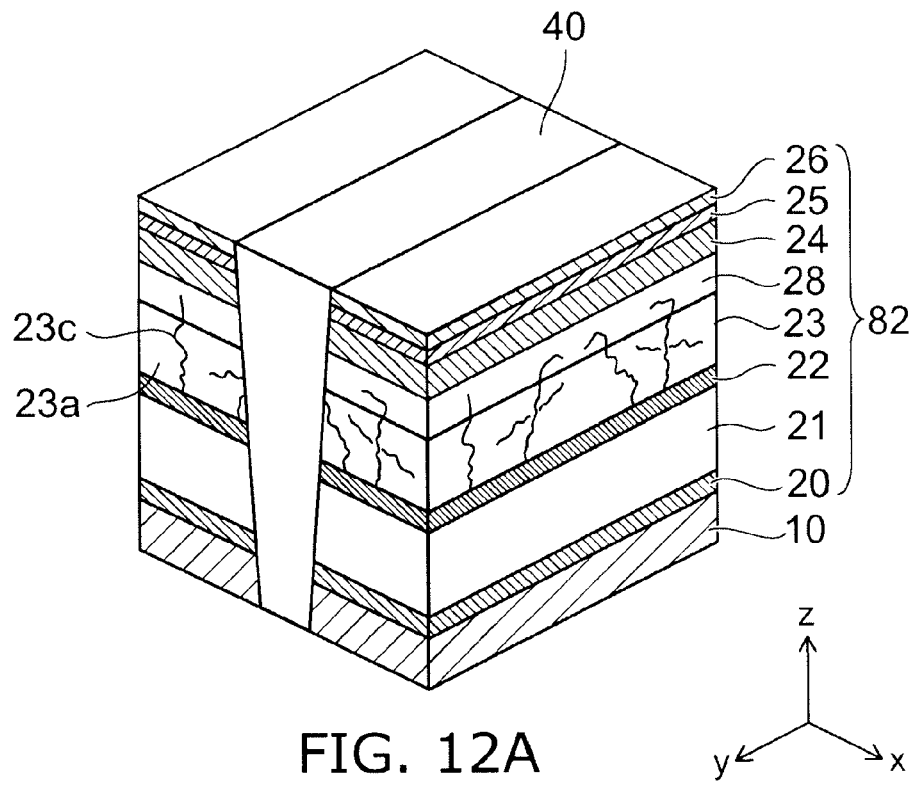

Next, selective etching processing (not shown) is performed on the stacked structure 82 shown in FIG. 11B. Furthermore, an insulating film (element isolation layer) is buried in the etched portion to form the element isolation layer 40 in the stacked structure 82 as shown in FIG. 12A. The element isolation layer 40 extends in the Y-axis direction. At this time, the lower interconnections 10 extending in the Y-axis direction are formed in the lowermost layer of the stacked structure 82.

Figure 12B:
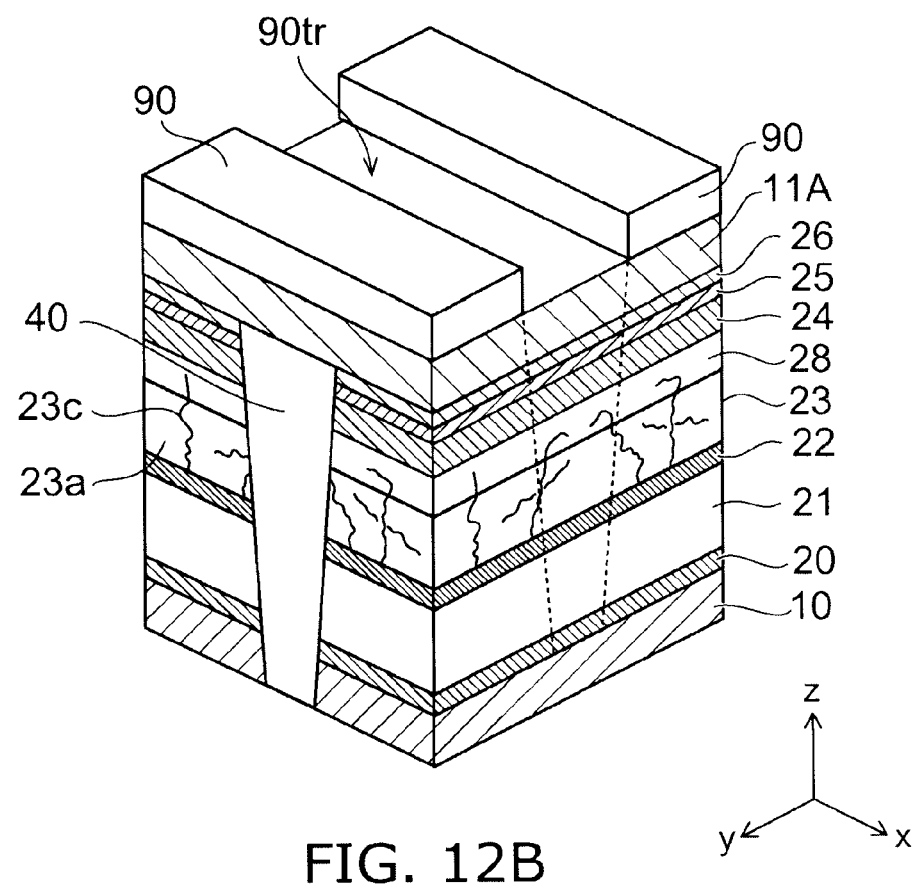

Next, as shown in FIG. 12B, the planar (blanket) upper interconnection layer 11A is formed on the stacked structure 82. The upper interconnection layer 11A is formed illustratively by the sputtering process or CVD process. Subsequently, the mask member 90 is patterned on the upper interconnection layer 11A.

The groove portion 90tr extending in the X-axis direction is formed between the portions of this mask member 90. The upper interconnection layer 11A appears from the bottom of the groove portion 90tr.

Figure 13A:
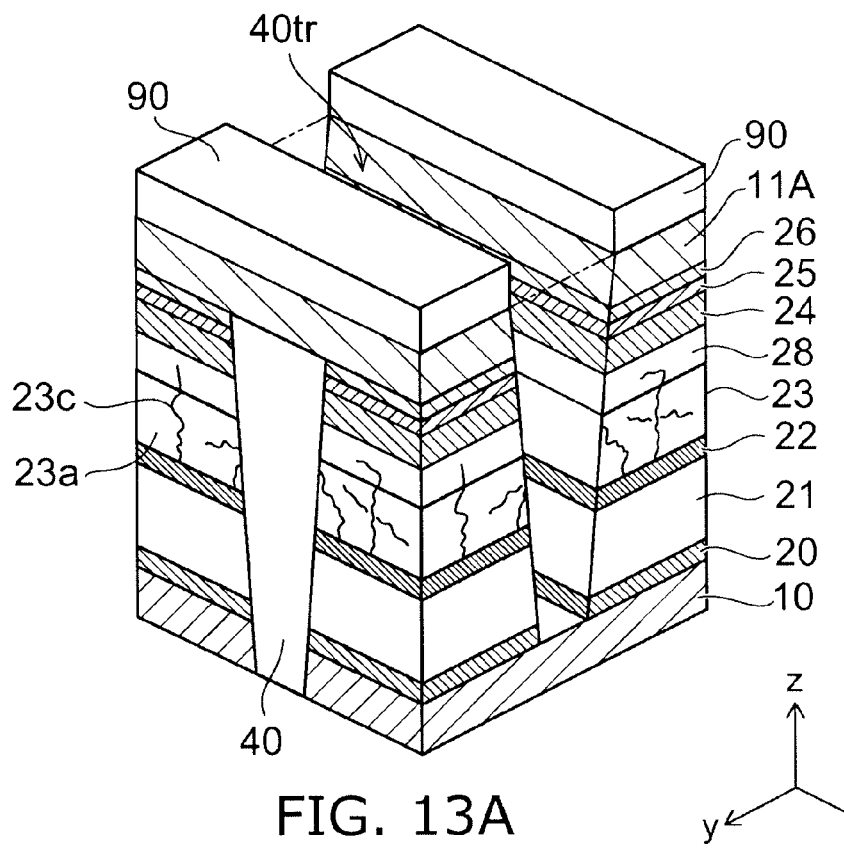

Subsequently, the stacked structure 82 located below the groove portion 90tr is selectively removed by etching. For instance, the portion appearing from the groove portion 90tr is removed by etching from the upper interconnection layer 11A down to the metal film 20. This state is shown in FIG. 13A.

Thus, the aforementioned portion indicated by the dotted line 91 is etched, and a trench 40tr is formed in the stacked structure 82. The trench 40tr extends in the X-axis direction. That is, the extending direction of the trench 40tr is generally perpendicular to the extending direction of the lower interconnection 10.

Figure 13B:
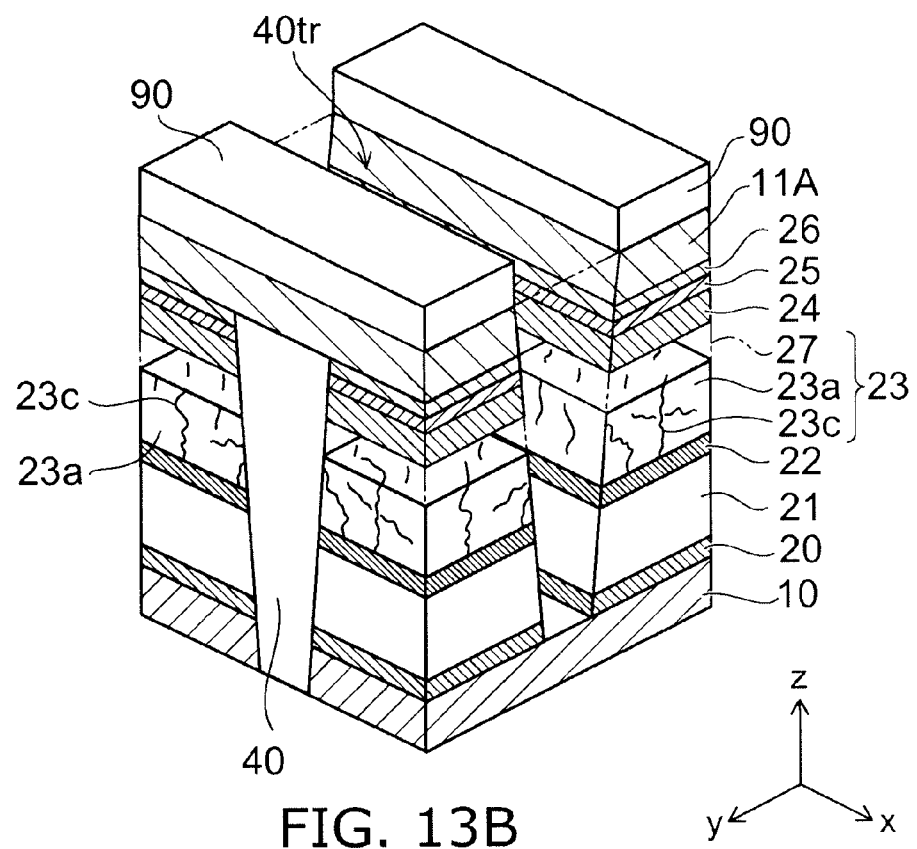

Subsequently, the inside of the trench 40tr is exposed to an activated oxygen ($O_2$) plasma, or an organic solvent such as acetone and alcohol to selectively remove the organic coating 28. Thus, the portion occupied by the organic coating 28 turns into the gap 27. This state is shown in FIG. 13B.

Subsequently, the element isolation layer 40 is buried in this removed portion. The mask member 90 is removed by CMP.

Figure 14:
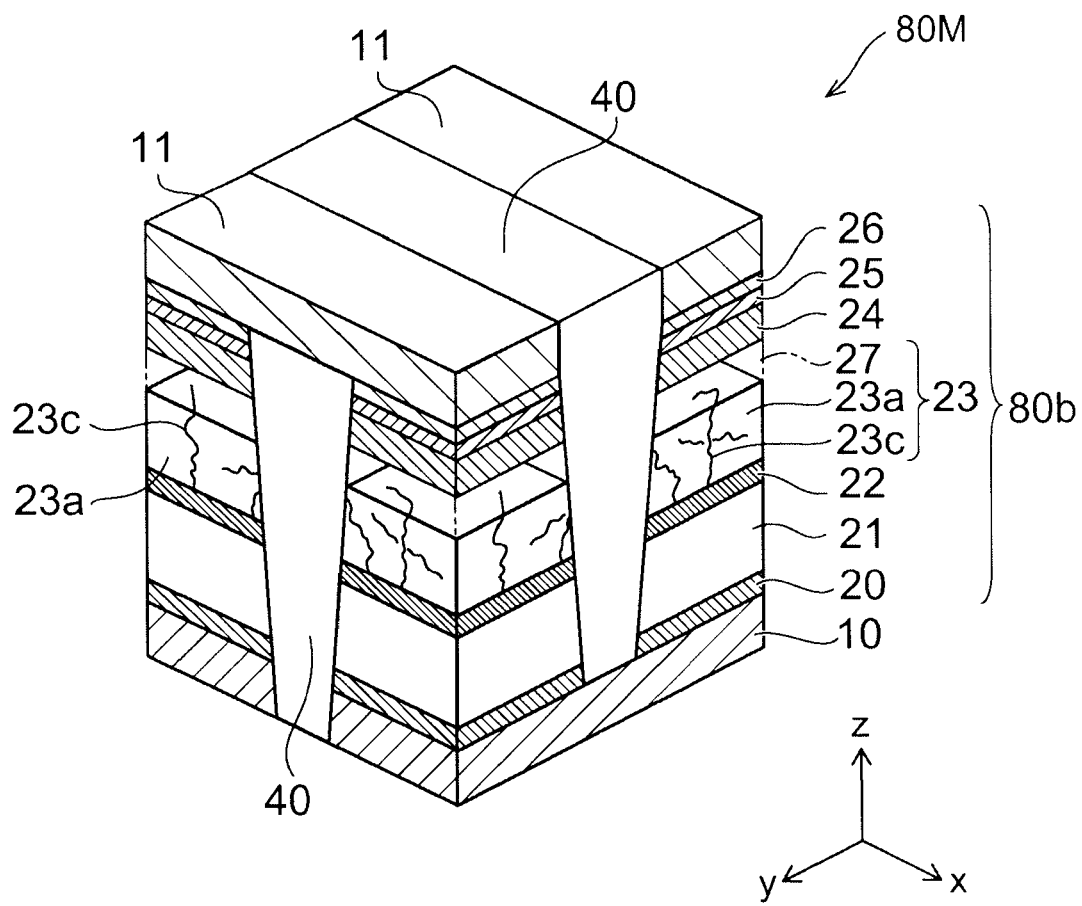

By such a manufacturing process, the memory section 80M shown in FIG. 14 is formed. As shown, the memory cell 80b is provided at the crossing position of the lower interconnection 10 and the upper interconnection 11.

In the memory cell 80b, to increase the flexibility of motion of the CNTs 23c at the time of the forming, the insulating film 23a is preferably made of a low-k material, which has a lower density than high-k materials.

Thus, the CNT-containing layer 23 of the second embodiment includes CNTs 23c, the insulating film 23a, and the gap 27. At least one CNT 23c of a plurality of the CNTs 23c extends from the insulating film 23a into the gap 27. One end of the CNT 23c extending into the gap 27 is brought into contact with the memory layer, and the other end of the CNT 23c is electrically connected to the lower interconnection 10. Furthermore, the stacked structure of the metal film 22, CNT-containing layer 23, resistance change film 24, and metal film 25 is formed by a simple method. Thus, the memory cell 80b with low power consumption and high productivity is formed.

The embodiments have been described with reference to examples. However, the embodiments are not limited to these examples. For instance, the components of the above examples and the layout, material, condition, shape, size and the like thereof are not limited to those illustrated, but can be suitably modified.

The nonvolatile memory device of the embodiments is not limited to the so-called cross-point type in which a memory cell is connected at the crossing position of two interconnections. In addition, for instance, the so-called probe memory in which a probe is brought into contact with each of a plurality of memory cells to perform writing and reading, and the memory of the type in which a memory cell is selected by a transistor or other switching element to perform writing and reading, are also encompassed within the scope of the embodiments.

For instance, the embodiments are applicable also to cross-point formation of an MRAM (magnetoresistive random access memory). Furthermore, the embodiments also include a configuration in which the diode layer 21 is removed from the memory cell 80a, 80b as necessary. Furthermore, the embodiments also include a configuration in which the metal film 20, 22, 25 and the stopper interconnection film 26 are removed from the memory cell 80a, 80b as necessary.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the invention.

The invention claimed is:

1. A nonvolatile memory device comprising:
   a memory cell connected to a first interconnection and a second interconnection,
   the memory cell including a plurality of layers,
   the plurality of layers including:
   a memory layer; and
   a carbon nanotube-containing layer being in contact with the memory layer and containing a plurality of carbon nanotubes,
   at least one of the plurality of carbon nanotubes being a multi-wall nanotube.

2. The device according to claim 1, wherein an end of at least one carbon nanotube of the plurality of carbon nanotubes is in contact with the memory layer.

3. The device according to claim 1, wherein the first interconnection is electrically connected to the memory layer through at least one carbon nanotube of the plurality of carbon nanotubes.

4. The device according to claim 1, wherein the plurality of carbon nanotubes are dispersed in an insulating film.

5. The device according to claim 4, wherein the insulating film is made of one of silicon oxide ($SiO_2$), alumina ($Al_2O_3$), silicon carbide oxide (SiOC), and magnesium oxide (MgO).

6. The device according to claim 4, wherein the insulating film is made of an organic insulating film.

7. A nonvolatile memory device comprising:
   a memory cell connected to a first interconnection and a second interconnection,
   the memory cell including a plurality of layers,
   the plurality of layers including:
   a memory layer; and
   a carbon nanotube-containing layer being in contact with the memory layer and containing a plurality of carbon nanotubes,
   the carbon nanotube-containing layer including a gap provided with respect to the memory layer.

8. The device according to claim 7, wherein at least one carbon nanotube of the plurality of carbon nanotubes extends into the gap and has an end in contact with the memory layer.

9. The device according to claim 1, wherein the first interconnection extends in a first direction, the second interconnection extends in a second direction non-parallel to the first direction, and the first interconnection crosses the second interconnection.

10. The device according to claim 7, wherein the first interconnection is electrically connected to the memory layer through at least one carbon nanotube of the plurality of carbon nanotubes.

11. The device according to claim 7, wherein at least one of the plurality of carbon nanotubes is a single-wall nanotube.

12. The device according to claim 7, wherein at least one of the plurality of carbon nanotubes is a multi-wall nanotube.

13. The device according to claim 7, wherein the plurality of carbon nanotubes are dispersed in an insulating film.

14. The device according to claim 13, wherein the insulating film is made of one of silicon oxide ($SiO_2$), alumina ($Al_2O_3$), silicon carbide oxide (SiOC), and magnesium oxide (MgO).

15. The device according to claim 13, wherein the insulating film is made of an organic insulating film.

16. The device according to claim 7, wherein the first interconnection extends in a first direction, the second interconnection extends in a second direction non -parallel to the first direction, and the first interconnection crosses the second interconnection.

* * * * *